United States Patent
Johnson et al.

(10) Patent No.: US 7,091,763 B1
(45) Date of Patent: Aug. 15, 2006

(54) CLOCK GENERATION

(75) Inventors: Phillip Johnson, Hellertown, PA (US); William Andrews, Emmaus, PA (US); Fulong Zhang, Willow Grove, PA (US); Gary Powell, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 135 days.

(21) Appl. No.: 10/701,005

(22) Filed: Nov. 3, 2003

(51) Int. Cl.
*H03K 3/17* (2006.01)

(52) U.S. Cl. ...................... 327/175; 327/176
(58) Field of Classification Search ................ 327/165, 327/166, 175, 176, 155, 156, 159
See application file for complete search history.

(56) References Cited

U.S. PATENT DOCUMENTS

| | | | | |
|---|---|---|---|---|
| 5,083,049 A * | 1/1992 | Kagey | ...................... | 327/141 |
| 5,327,019 A * | 7/1994 | Kluck | ...................... | 327/202 |
| 5,903,195 A * | 5/1999 | Lukes et al. | ...................... | 331/4 |
| 5,953,386 A * | 9/1999 | Anderson | ...................... | 375/376 |
| 6,147,530 A * | 11/2000 | Nogawa | ...................... | 327/156 |
| 6,429,734 B1 * | 8/2002 | Wang et al. | ...................... | 327/558 |
| 6,452,432 B1 * | 9/2002 | Kim | ...................... | 327/158 |

* cited by examiner

*Primary Examiner*—Timothy P. Callahan
*Assistant Examiner*—An T. Luu
(74) *Attorney, Agent, or Firm*—MacPherson Kwok Chen & Heid LLP; Greg J. Michelson (57) ABSTRACT

Clock generation techniques are disclosed to provide clock generation with duty cycle replication. The clock generation techniques may further compensate for clock insertion delays and minimize distortion due to clock distribution networks.

29 Claims, 6 Drawing Sheets

CLOCK GENERATION

TECHNICAL FIELD

The present invention relates generally to electrical circuits and, more particularly, to clock generation techniques.

BACKGROUND

Integrated circuits generally rely on precise clock signals to perform their intended functions. Integrated circuit performance may suffer if the clock signal is degraded, such as from duty cycle distortion of the clock signal. Duty cycle refers to the relative relation between the positive and negative pulse widths of the clock signal (e.g., a sinusoidal signal). Duty cycle distortion may occur due, for example, to process, voltage, and temperature (PVT) variations.

As integrated circuit performance and interface speeds increase, there is a greater need to control duty cycle distortion because the distortion, for example, may degrade a larger percentage of the shrinking clock period. Furthermore, system and interface requirements increasingly utilize both edges (i.e., the rising and falling edges or different phases of the clock signal) to increase performance and thus, duty cycle distortion becomes increasingly significant.

Additionally, timing margins may be reduced when the duty cycle of the incoming clock is not matched or when internal circuits contribute to the distortion of the duty cycle. Consequently, duty cycle distortion may make it difficult to meet system timing requirements and may affect timing equations. As a result, there is a need for techniques to reduce duty cycle distortion.

SUMMARY

Systems and methods are disclosed herein to provide clock generation. For example, in accordance with an embodiment of the present invention, clock generation techniques are provided to control a duty cycle of a clock signal to reduce duty cycle distortion. The clock generation techniques may further include compensation for clock insertion delays.

More specifically, in accordance with one embodiment of the present invention, a circuit includes a first clock generator adapted to receive a reference signal and a feedback signal and provide a first clock signal; a second clock generator adapted to receive the complement of the reference signal and the complement of the feedback signal and provide a second clock signal; and a clock recombination circuit adapted to receive the first and second clock signal and provide a third clock signal having approximately the same duty cycle as the reference signal.

In accordance with another embodiment of the present invention, a method of generating a clock signal includes receiving a reference signal; receiving a feedback signal; generating a first and second clock signal based on the reference signal and the feedback signal; and combining the first and second clock signal to provide a third clock signal having a duty cycle approximately equivalent to a duty cycle of the reference signal.

In accordance with another embodiment of the present invention, a clock circuit includes a first clock generator adapted to receive a reference signal and a feedback signal and provide a first clock signal as a first clock output signal; and a second clock generator adapted to receive the reference signal, the feedback signal, and the first clock output signal and provide a second clock signal as a second clock output signal, the second clock generator having a duty cycle generator to selectively combine the second clock signal with the first clock output signal such that the second clock output signal has approximately the same duty cycle as the reference signal.

In accordance with another embodiment of the present invention, a method of generating clock signals includes receiving a reference signal; receiving a feedback signal; generating a first clock signal based on the reference signal and the feedback signal; generating a second clock signal based on the reference signal and the feedback signal; and providing the first and second clock signals as clock output signals or combining the second clock signal with the first clock signal to generate a third clock signal having approximately the same duty cycle as the reference signal and providing the third clock signal with the first or second clock signal as the clock output signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
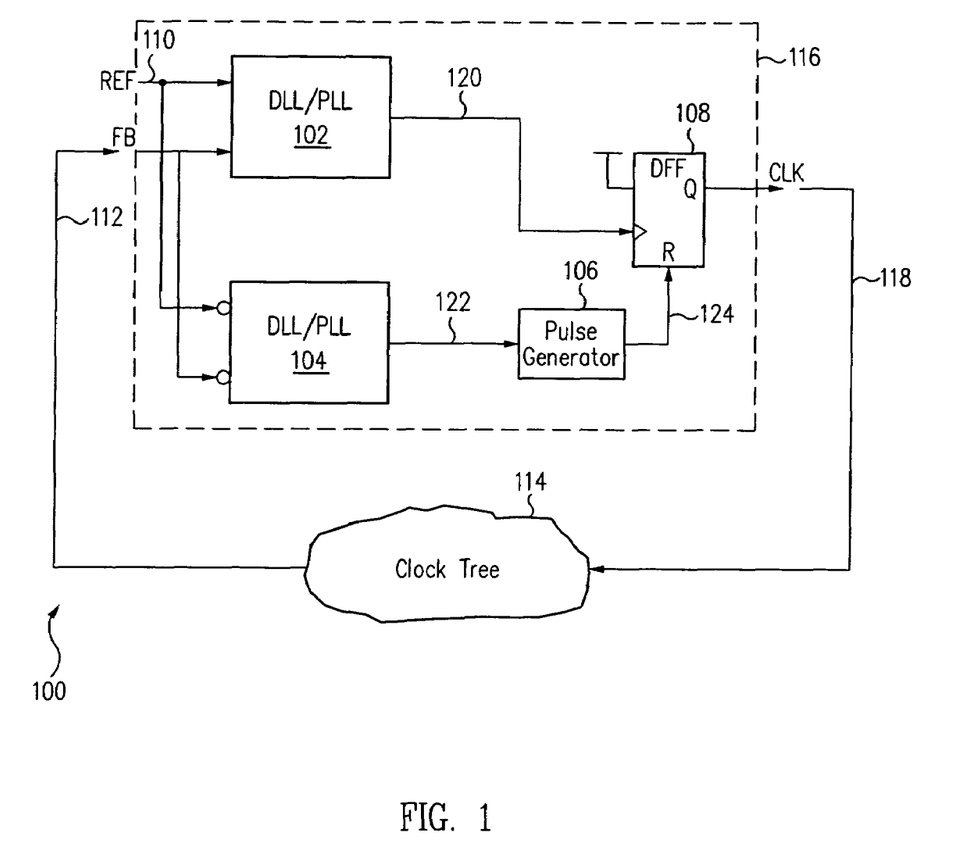
FIG. 1 shows a block diagram illustrating a clock network in accordance with an embodiment of the present invention.

FIG. 1 shows a block diagram illustrating a clock network 100 in accordance with an embodiment of the present invention. Clock network 100 includes clock generators 102 and 104, a pulse generator 106, a flip flop 108, and a clock tree 114. Clock generators 102 and 104, pulse generator 106, and flip flop 108 form a clock generator circuit 116, which may, for example, be within an integrated circuit to provide clock generation and control.

Clock generators 102 and 104 receive a reference clock signal 110 and a feedback clock signal 112 and generate corresponding clock signals 120 and 122. Clock generator 102 locks onto a leading edge of reference clock signal 110 while clock generator 104 locks onto a trailing edge of reference clock signal 110. In general, clock generators 102 and 104 will have different bandwidths to avoid any possible instability (i.e., if clock generators 102 and 104 are both phase-locked loop circuits). Clock signal 120 clocks flip flop 108 while clock signal 122 via pulse generator 106 provides a clock signal 124 to a reset terminal (labeled R) of flip flop 108, which provides a clock signal 118.

Clock signal 118 may be fed back through clock tree 114 to provide feedback signal 112 to clock generators 102 and 104. As explained in greater detail below, clock signal 118 maintains the duty cycle of reference clock signal 110 and, in accordance with this embodiment, accounts for clock insertion delay of clock generator circuit 116 and clock tree 114 by providing feedback clock signal 112 via clock tree 114. Alternatively, in accordance with an embodiment of the present invention, clock signal 118 may be fed back directly as feedback clock signal 112 in clock network 100 (i.e., bypassing clock tree 114) such that clock signal 118 maintains the original duty cycle of reference clock signal 110 without removing the clock insertion delay associated with clock tree 114.

Clock generators 102 and 104 may each represent, for example, a delay-locked loop (DLL) or a phase-locked loop (PLL). In general, a PLL generates a clock signal with a duty cycle having no relation to its reference clock (e.g., a clock signal having a duty cycle of fifty percent and a frequency of some multiple of the frequency of the reference clock). A DLL may preserve the duty cycle of its reference clock, depending upon the selected circuit topology, but does not generally compensate for duty cycle distortions within the integrated circuit (e.g., distortions of the clock signal occurring during distribution through a clock tree).

However, in contrast, clock network 100 provides clock signal 118, which compensates for clock insertion delay (e.g., due to clock tree 114) while maintaining the original duty cycle of reference clock signal 110. Consequently, for example, one or more embodiments of the present invention may simplify the implementation of systems having stringent clock specifications (e.g., such as double data rate (DDR) or quad data rate (QDR) specifications).

Figure 2:
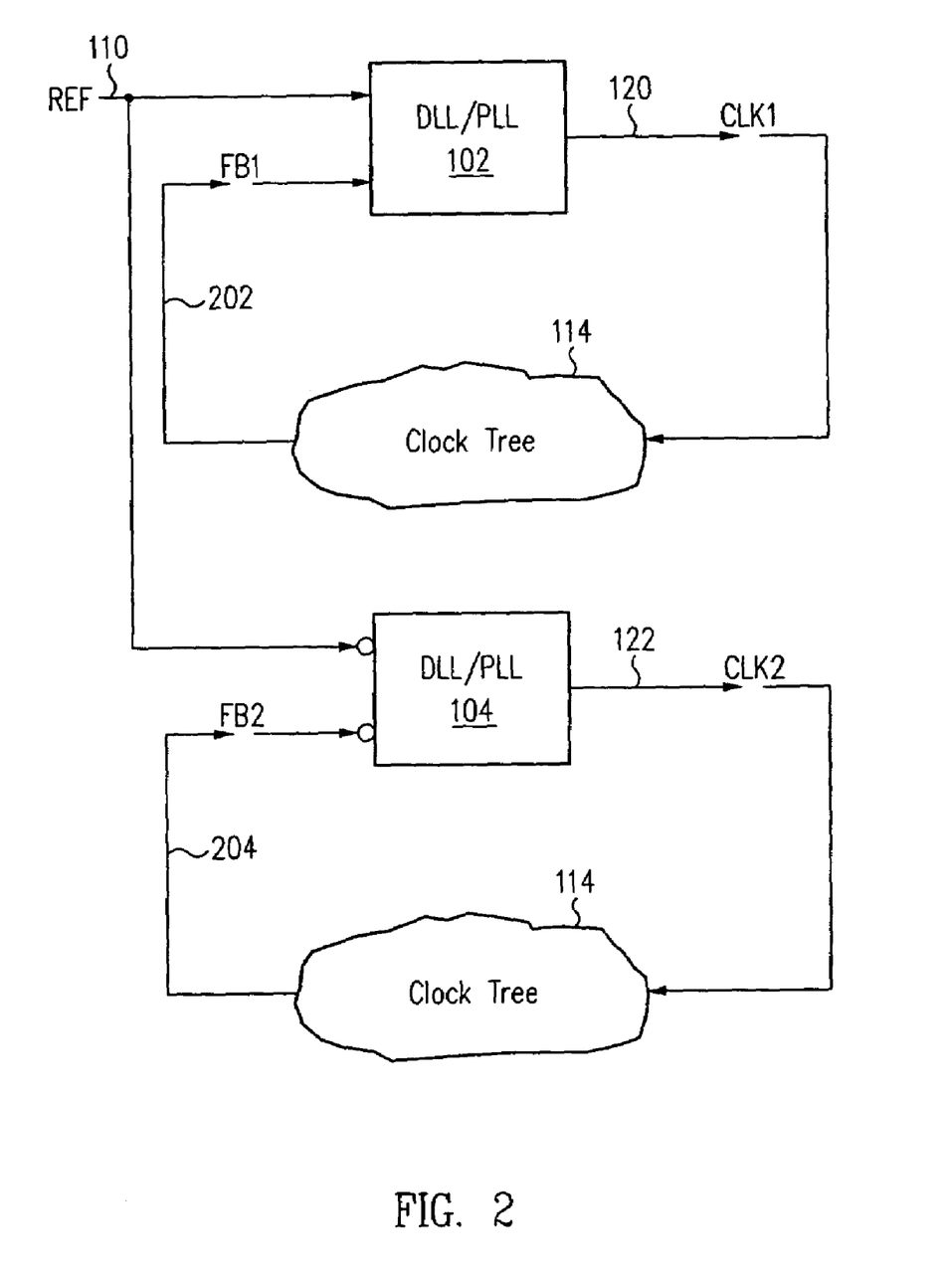
FIG. 2 shows a block diagram illustrating clock networks in accordance with an embodiment of the present invention.

The general operation of clock network 100 may be better understood by describing the operation of each clock generator 102 and 104 separately. For example, FIG. 2 illustrates clock generators 102 and 104 providing their corresponding clock signals 120 and 122 through separate (but substantially identical) clock trees 114 and receiving corresponding feedback clock signals 202 and 204. As in clock network 100, clock generators 102 and 104 receive reference clock signal 110.

Figure 3:
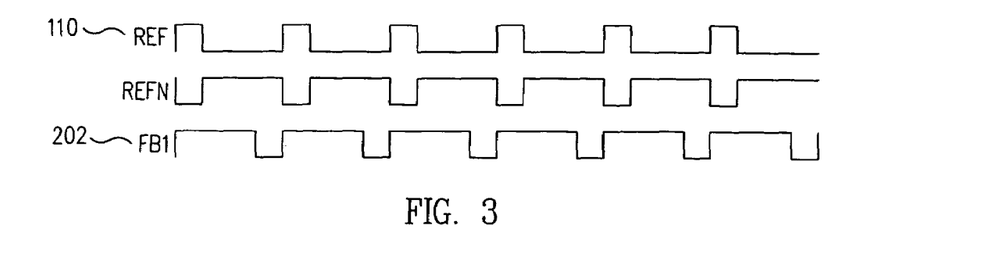
FIG. 3 shows a timing diagram for FIG. 2 in accordance with an embodiment of the present invention.
Figure 4:
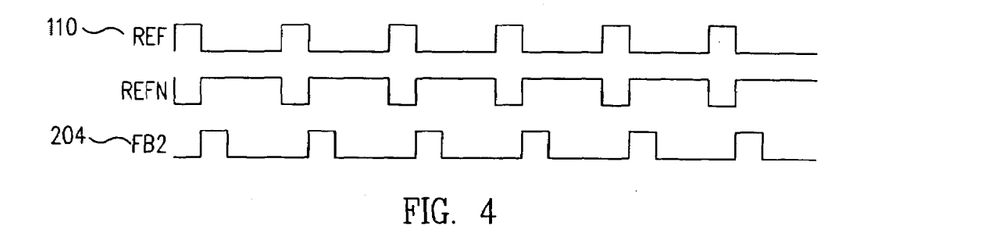
FIG. 4 shows a timing diagram for FIG. 2 in accordance with an embodiment of the present invention.

FIGS. 3 and 4 show timing diagrams with exemplary waveforms for clock generators 102 and 104, respectively. For example, FIG. 3 illustrates in an exemplary fashion feedback clock signal 202 (e.g., a DLL locked waveform), which has a distorted duty cycle of approximately 75%/25% (positive clock cycle/negative clock cycle) as compared to the duty cycle of reference clock signal 110 of approximately 25%/75%. FIG. 4 illustrates in an exemplary fashion feedback clock signal 204 (e.g., a DLL locked waveform), which has a distorted duty cycle of approximately 25%/75% as compared to the duty cycle of the inverted form of reference clock signal 110 of approximately 75%/25%.

Figure 5:
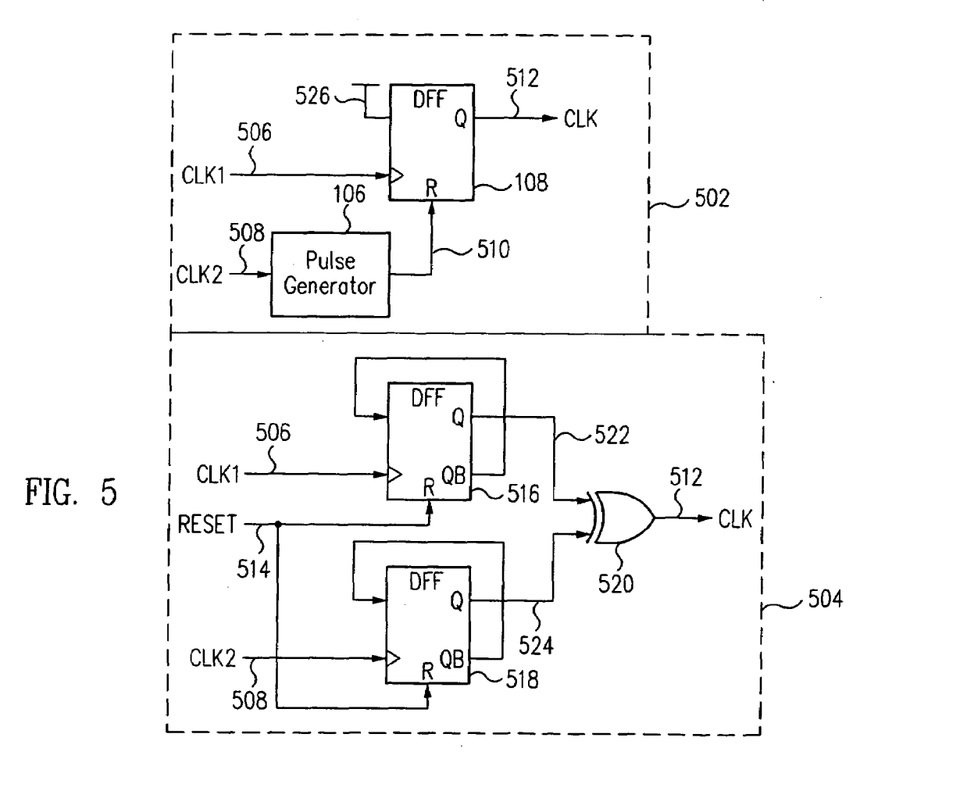
FIG. 5 shows a block diagram illustrating clock generation techniques in accordance with an embodiment of the present invention.

Reference clock signal 110 may be recreated by merging feedback clock signals 202 and 204 together. The resulting merged signal is substantially free of duty cycle distortion and also free of the clock insertion delay due to clock tree 114, because feedback clock signals 202 and 204 are distributed through clock tree 114. For example, FIG. 5 illustrates two techniques, a circuit 502 and a circuit 504, for merging clock signals.

Circuit 502 includes pulse generator 106 and flip flop 108 (e.g., a set/reset flip flop). Pulse generator 106 is utilized to minimize the reset period, which guarantees that the reset period has completed before the next clock edge. Flip flop 108 is clocked by a clock signal 506 while pulse generator 106 receives a clock signal 508 and generates a clock signal 510 (a reset signal) for flip flop 108. Flip flop 108 also receives a voltage reference signal 526 and provides a clock signal 512.

Figure 6:
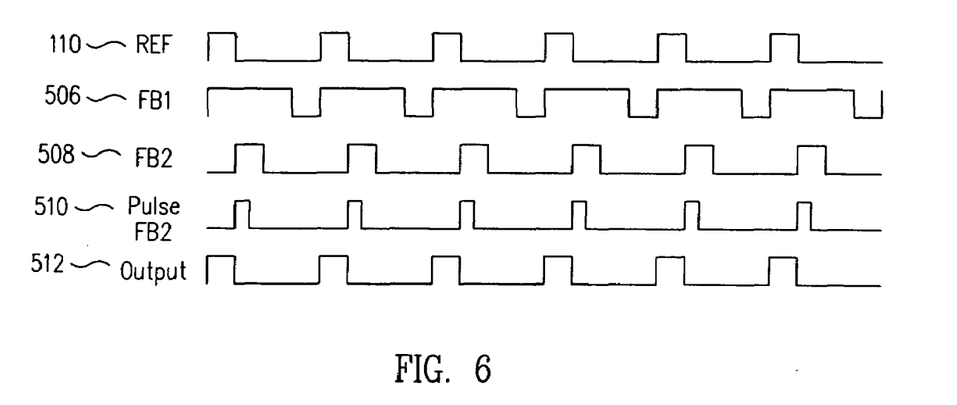
FIG. 6 shows a timing diagram for FIG. 5 in accordance with an embodiment of the present invention.

Exemplary waveforms for circuit 502 are illustrated in the timing diagram shown in FIG. 6. As an example, the exemplary waveforms of feedback signals 202 and 204 (labeled FB1 and FB2 in FIGS. 2–4) are provided as clock signals 506 and 508, respectively, with the resulting clock signal 512 provided as an output signal having a duty cycle approximately equal to the duty cycle of reference clock signal 110. Circuit 502 was utilized in clock network 100, as discussed above in reference to FIG. 1, to merge clock signals 120 and 122 together to provide clock signal 118.

Circuit 504 includes flip flops 516 and 518 and a logic gate (exclusive-OR or XOR) 520. Flip flops 516 and 518, which function as divide by two circuits, receive clock signals 506 and 508 and a reset signal 514. Logic gate 520 receives output signals 522 and 524 from respective flip flops 516 and 518 and provides clock signal 512.

Figure 7:
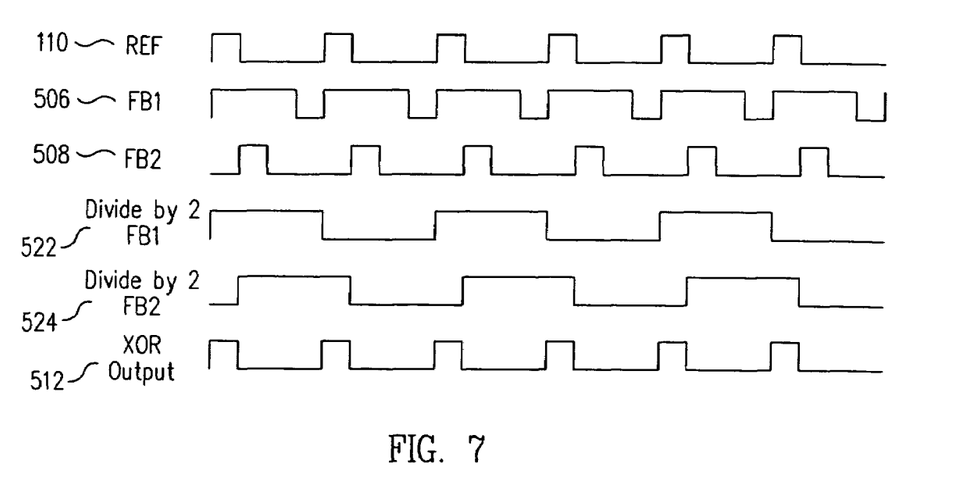
FIG. 7 shows a timing diagram for FIG. 5 in accordance with an embodiment of the present invention.

Exemplary waveforms for circuit 504 are illustrated in the timing diagram shown in FIG. 7. As an example, the exemplary waveforms of feedback signals 202 and 204 (labeled FB1 and FB2 in FIGS. 2–4) are provided as clock signals 506 and 508, respectively. The resulting clock signal 512 is provided as an output signal having a duty cycle approximately equal to the duty cycle of reference clock signal 110 (e.g., given that flip flops 516 and 518 come out of their reset condition at approximately the same time).

Figure 8:
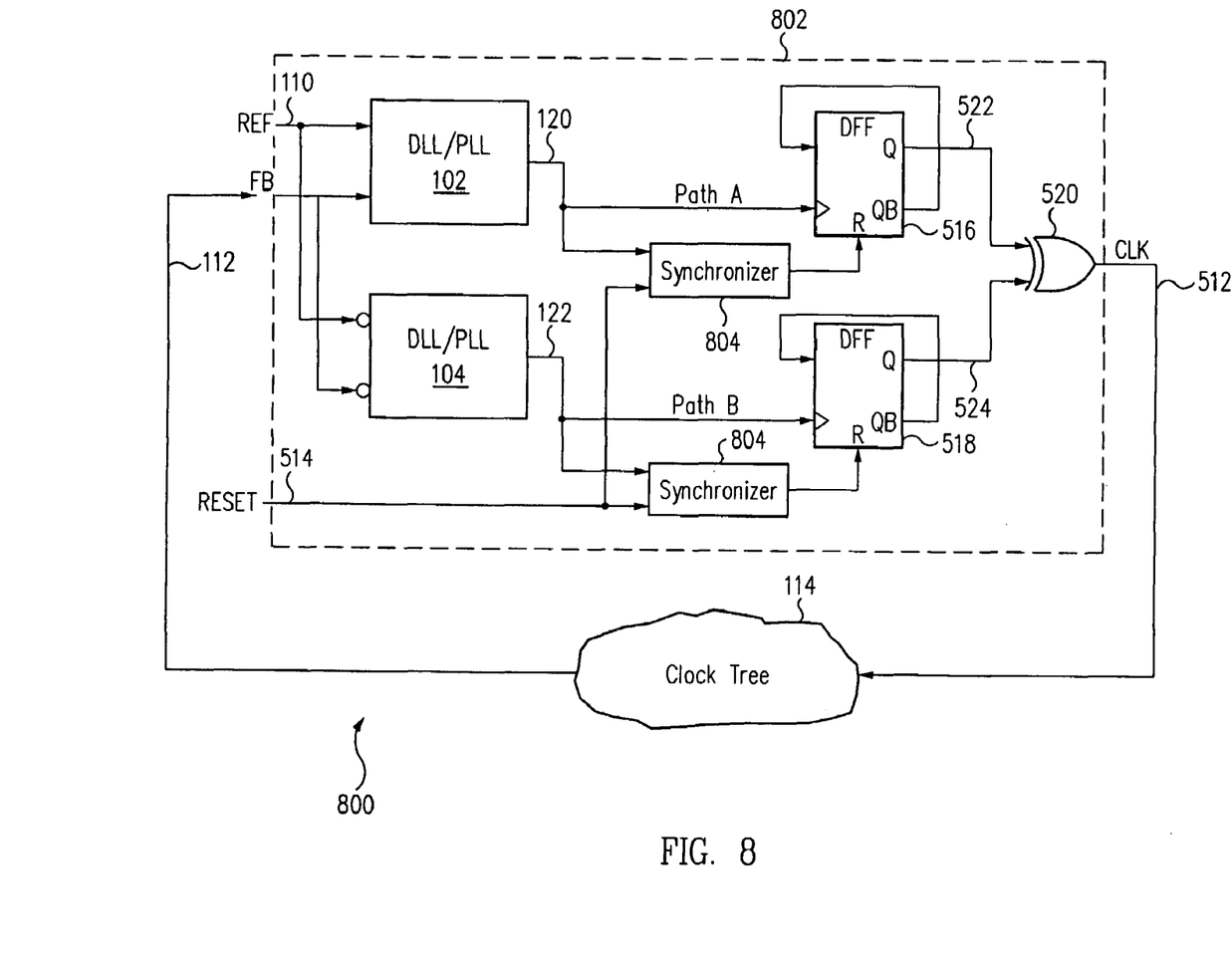
FIG. 8 shows a block diagram illustrating clock generation techniques in accordance with an embodiment of the present invention.

It should be understood that circuit 504 may be substituted for circuit 502 in clock network 100 (FIG. 1) to merge clock signals 120 and 122 (corresponding to clock signals 506 and 508) together to provide clock signal 118. For example, FIG. 8 shows a block diagram illustrating a clock network 800 in accordance with an embodiment of the present invention. Clock network 800 is similar to clock network 100 (FIG. 1), but substitutes circuit 504 for circuit 502 to form a clock generator circuit 802 that provides clock signal 512 having a duty cycle substantially equivalent to the duty cycle of reference clock signal 110.

Figure 9:
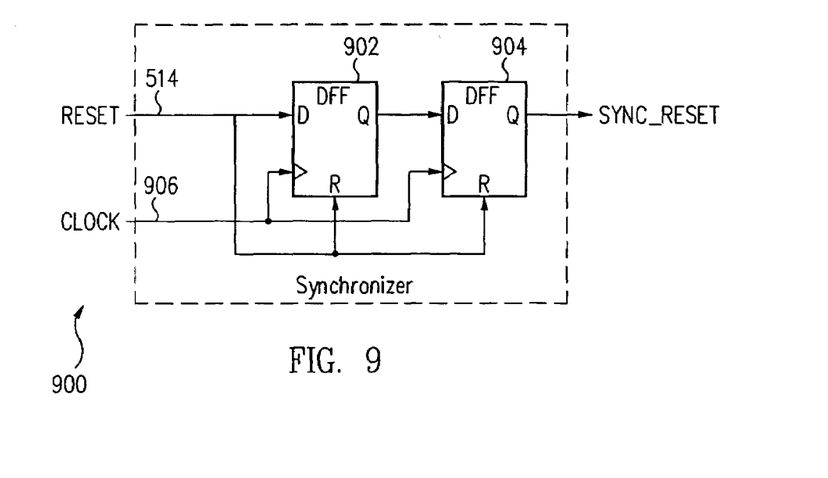
FIG. 9 shows an exemplary detailed portion of FIG. 8.

Clock network 800 also optionally includes synchronizers 804, which synchronize reset signal 514 to clock signals 120 and 122 (e.g., to provide adequate phase alignment, such as upon start-up). An exemplary circuit diagram for synchronizer 804 is illustrated by circuit 900 shown in FIG. 9. Circuit 900 includes flip flops 902 and 904, which receive reset signal 514 and a clock signal 906. Clock signal 906 corresponds to either clock signal 120 or clock signal 122, depending upon whether circuit 900 is associated with clock generator 102 or 104. Circuit 900 provides a synchronized reset signal (labeled sync_reset).

Figure 10:
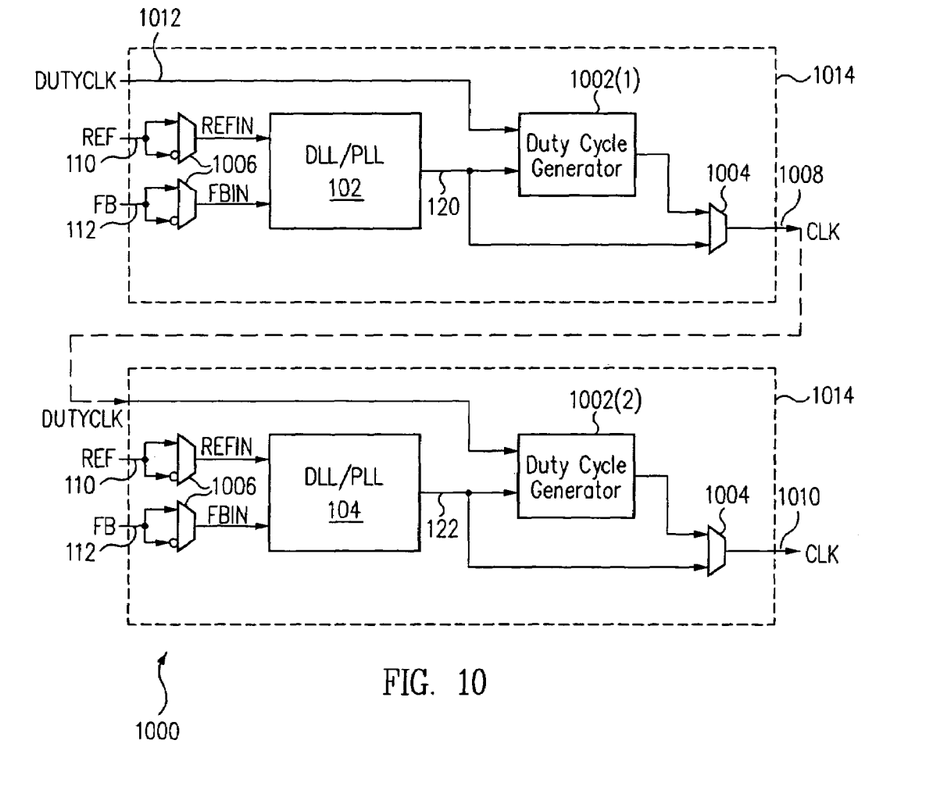
FIG. 10 shows a block diagram illustrating clock generation techniques in accordance with an embodiment of the present invention.

FIG. 10 shows a block diagram illustrating a clock generator circuit 1000 in accordance with an embodiment of the present invention. Clock generator circuit 1000 illustrates programmable options for clock generation techniques discussed herein. Clock generator circuit 1000 includes clock generators 102 and 104, duty cycle generators 1002, and multiplexers 1004 and 1006.

Multiplexers 1006 allow clock generators 102 and 104 to operate independently on either rising or falling clock edges of reference clock signal 110 and feedback clock signal 112. Multiplexers 1004 allow the independent selection of clock signals 120 and 122 from respective clock generators 102 and 104 or output signals from associated duty cycle generators 1002.

Duty cycle generators 1002 (which are separately referenced as 1002(1) and 1002(2)) represent clock recombination logic, such as discussed above in reference to FIGS. 1, 5, and 8 (e.g., each duty cycle generator 1002 may represent circuit 502 or circuit 504). Thus, duty cycle generators 1002 may be employed to provide a clock signal (e.g., a clock signal 1008 or a clock signal 1010) having a duty cycle that replicates the duty cycle of reference clock signal 110.

For example, clock signal 1008 may be provided to duty cycle generator 1002(2), which also receives clock signal 122, to provide clock signal 1010 (via associated multiplexer 1004) having approximately the same duty cycle as reference clock signal 110. Alternatively, multiplexer 1004 may select clock signal 122 to provide as clock signal 1010. Similarly, clock signal 1010 may be provided as a clock signal 1012 to duty cycle generator 1002(1), which also receives clock signal 120, to provide clock signal 1008 (via associated multiplexer 1004) having approximately the same duty cycle as reference clock signal 110.

Consequently, clock generator circuit 1000 may provide clock signals 120 and 122 as corresponding clock signals 1008 and 1010. Alternatively, clock signals 120 and 122 may be combined to provide a clock signal (i.e., either as clock signal 1008 or clock signal 1010) that provides duty cycle replication relative to reference clock signal 110.

It should be understood that clock generator circuit 1000 may be viewed as formed by two clock generator circuits 1014. Thus, any number of clock generator circuits 1014 may be implemented and combined to provide the desired clock signals, depending upon the application. Furthermore, clock generator circuit 1014 may receive the same or different reference clock signals 1014 (e.g., different frequencies) and their feedback clock signals 112 may or may not be independently routed through clock networks (e.g., clock tree 114).

In accordance with one or more embodiments of the present invention, clock generation techniques are disclosed to provide clock generation with duty cycle replication to minimize duty cycle distortion. One or more of these techniques may be utilized with or without the removal of clock insertion delay. Furthermore, one or more of these techniques may be utilized to minimize distortion due to potentially large on-chip or on-board clock distribution trees (e.g., clock networks).

In accordance with one embodiment of the present invention, two clock generation circuits receive true and complement versions of an input reference clock signal, respectively, and also receive true and complement versions, respectively, of the fed back clock signal (e.g., the distributed clock signal at the end of a clock distribution tree). Each clock generation circuit generates a local clock signal synchronized to the input reference clock signal (i.e., one local clock signal synchronized to the true version and one local clock signal synchronized to the complement version of the input reference clock signal) with no strict duty cycle requirement for the local clock signals. A clock recombination circuit (e.g., circuit 502 or circuit 504 of FIG. 5) combines the local clock signals to provide an output clock signal with approximate duty cycle replication of the input reference clock signal.

Embodiments described above illustrate but do not limit the invention. It should also be understood that numerous modifications and variations are possible in accordance with the principles of the present invention. Accordingly, the scope of the invention is defined only by the following claims.

We claim:

1. A circuit comprising:
   a first clock generator adapted to receive a reference signal and a feedback signal and provide a first clock signal;
   a second clock generator adapted to receive the complement of the reference signal and the complement of the feedback signal and provide a second clock signal; and
   a clock recombination circuit adapted to receive the first and second clock signal and provide a third clock signal having approximately the same duty cycle as the reference signal, wherein a leading edge of the third clock signal is based on a leading edge of the first clock signal, and a trailing edge of the third clock signal is based on a leading edge of the second clock signal.

2. The circuit of claim 1, wherein the first and second clock generators each comprise a delay-locked loop or a phase-locked loop.

3. The circuit of claim 1, wherein the clock recombination circuit comprises:
   a flip flop adapted to receive the first clock signal and provide the third clock signal; and
   a pulse generator adapted to receive the second clock signal and provide a reset signal to the flip flop.

4. The circuit of claim 1, wherein the clock recombination circuit comprises:
   a first flip flop adapted to receive the first clock signal and a reset signal and provide a first signal;
   a second flip flop adapted to receive the second clock signal and the reset signal and provide a second signal; and
   a logic gate adapted to receive the first and second signal and provide the third clock signal.

5. The circuit of claim 4, wherein the reset signal is synchronized to the first clock signal or the second clock signal.

6. The circuit of claim 4, wherein the logic gate is an exclusive OR gate.

7. The circuit of claim 1, wherein the third clock signal is fed back to provide the feedback signal.

8. The circuit of claim 1, wherein the third clock signal is fed back through a clock tree to provide the feedback signal.

9. The circuit of claim 8, wherein the circuit compensates for duty cycle distortion and clock insertion delay.

10. The circuit of claim 1, wherein the circuit provides the third clock signal and the first clock signal or the second clock signal.

11. The circuit of claim 1, wherein the first clock generator is further adapted to provide the first clock signal as a first clock output signal from the circuit, and the second clock generator is further adapted to provide the second clock signal as a second clock output signal from the circuit.

12. The circuit of claim 11, wherein the first and second clock generators are further adapted to select between the true and the complement of the reference signal and the feedback signal to provide their corresponding first and second clock signals.

13. The circuit of claim 1, wherein the duty cycle of the reference signal is a percentage that differs from approximately fifty percent.

14. A clock circuit comprising:
   means for receiving a reference signal and a feedback signal and generating a first clock signal;
   means for receiving the reference signal and the feedback signal and generating a second clock signal based on the complement of the reference signal and the feedback signal; and
   means for combining the first clock signal and the second clock signal to provide a third clock signal having substantially the same duty cycle as the reference signal, wherein a leading edge of the third clock signal is based on a leading edge of the first clock signal, and a trailing edge of the third clock signal is based on a leading edge of the second clock signal.

15. The clock circuit of claim 14, wherein the means for generating the first clock signal and the means for generating the second clock signal each comprises a delay-locked loop or a phase-locked loop.

16. The clock circuit of claim 14, wherein the means for combining comprises:
   a flip flop adapted to receive the first clock signal and provide the third clock signal; and
   a pulse generator adapted to receive the second clock signal and provide a reset signal to the flip flop.

17. The clock circuit of claim 14, wherein the means for combining comprises:
   a first flip flop adapted to receive the first clock signal and a reset signal and provide a first signal;
   a second flip flop adapted to receive the second clock signal and the reset signal and provide a second signal; and
   a logic gate adapted to receive the first and second signal and provide the third clock signal.

18. The clock circuit of claim 17, wherein the reset signal is synchronized to the first clock signal or the second clock signal.

19. The clock circuit of claim 14, wherein the third clock signal is fed back through a clock tree to provide the feedback signal, the clock circuit compensating for duty cycle distortion and clock insertion delay of the clock tree.

20. The clock circuit of claim 14, further comprising means for providing the third clock signal and either the first clock signal or the second clock signal.

21. The circuit of claim 14, wherein the duty cycle of the reference signal is a percentage that differs from approximately fifty percent.

22. A method of generating a clock signal, the method comprising;
   receiving a reference signal;
   receiving a feedback signal;
   generating a first and second clock signal based on the reference signal and the feedback signal, wherein the first clock signal is based on a true version of the reference signal and the feedback signal, and wherein the second clock signal is based on a complement version of the reference signal and the feedback signal; and
   combining the first and second clock signal to provide a third clock signal having a duty cycle approximately equivalent to a duty cycle of the reference signals wherein a leading edge of the third clock signal is based on a leading edge of the first clock signal, and a trailing edge of the third clock signal is based on a leading edge of the second clock signal.

23. The method of claim 22, further comprising providing the third clock signal as the feedback signal.

24. The method of claim 23, wherein the third clock signal travels through a clock tree prior to being fed back as the feedback signal to compensate for duty cycle distortion and clock insertion delay associated with the clock tree.

25. The method of claim 22, further comprising providing the first and second clock signal as clock output signals and/or the third clock signal as a clock output signal.

26. The method of claim 22, wherein the duty cycle of the reference signal is a percentage that differs from approximately fifty percent.

27. A method of generating clock signals, the method comprising:
   receiving a reference signal;
   receiving a feedback signal;
   generating a first clock signal based on the reference signal and the feedback signal;
   generating a second clock signal based on the reference signal and the feedback signal; and
   providing the first and second clock signals as clock output signals or combining the second clock signal with the first clock signal to generate a third clock signal having approximately the same duty cycle as the reference signal and providing the third clock signal with the first or second clock signal as the clock output signals, wherein a leading edge of the third clock signal is based on a leading edge of the first clock signal, and a trailing edge of the third clock signal is based on a leading edge of the second clock signal.

28. The method of claim 27, further comprising selecting between a true and a complement version of the reference signal and the feedback signal.

29. The method of claim 28, wherein the first clock signal is based on the true version of the reference signal and the feedback signal and the second clock signal is based on the complement version of the reference signal and the feedback signal, and wherein the duty cycle of the reference signal is a percentage that differs from approximately fifty percent.

* * * * *